US006775143B2

(12) United States Patent
Yen et al.

(10) Patent No.: US 6,775,143 B2
(45) Date of Patent: Aug. 10, 2004

(54) SERVER APPARATUS (76) Inventors: Heng-Chih Yen, 3FI.-1, No. 37, Bitan Rd., Shindian City, Taipei Hsien (TW); Chen-Tung Sun, No. 27-3, Taiping Rd., Chiatung Shiang, Pingtung Hsien (TW)

( * ) Notice: Subject to any disclaimer, the term of this patent is extended or adjusted under 35 U.S.C. 154(b) by 3 days.

(21) Appl. No.: 10/207,478

(22) Filed: Jul. 27, 2002

(65) Prior Publication Data
US 2004/0017663 A1 Jan. 29, 2004

(51) Int. Cl.[7] ................................................ H05K 7/16
(52) U.S. Cl. ...................... 361/727; 439/493; 211/41; 165/80.3
(58) Field of Search ................................ 361/724–727, 361/679–687; 174/254–255, 259; 439/493; 211/41; 165/80.2, 80.3, 122

(56) References Cited

U.S. PATENT DOCUMENTS 5,222,907 A * 6/1993 Katabuchi et al. .......... 439/377
5,493,473 A * 2/1996 Yanagi ........................ 361/695
6,496,366 B1 * 12/2002 Coglitore et al. ........... 361/687
6,531,662 B1 * 3/2003 Nakamura .................. 174/255

* cited by examiner

Primary Examiner—Hung Van Duong
(74) Attorney, Agent, or Firm—Pro-Techtor International Services (57) ABSTRACT The invention discloses a server apparatus, comprising a case, a backboard, a signal-exchange device and a plurality of computer devices. There are two breaches on the front and the back of the case, and there are a plurality of symmetric guiders in the vertical inner side. The backboard has two faces, one sticking on the breach of the back of the case and there are a plurality of connect-slots, each slot connecting the others through electric signals. The back of the signal-exchange device and computer device respectively sets at least a first and second connector and the vertical width of the signal-exchange device is smaller than the width of the guider; thereby, we can set the signal-exchange and computer device into the symmetric guiders. While the computer device and the signal-exchange device completely slide into the case, the first connector and the second connector wedge in the corresponding connect-slots.

19 Claims, 7 Drawing Sheets

SERVER APPARATUS

BACKGROUND OF THE INVENTION

1. Field of the Invention

This invention discloses a server apparatus, especially provides a guider, backboard and slots on the backboard to make computer devices slide into the corresponding guider and make the backs of the computer devices directly wedges in the slots.

2. Description of the Related Art

Figure 1:
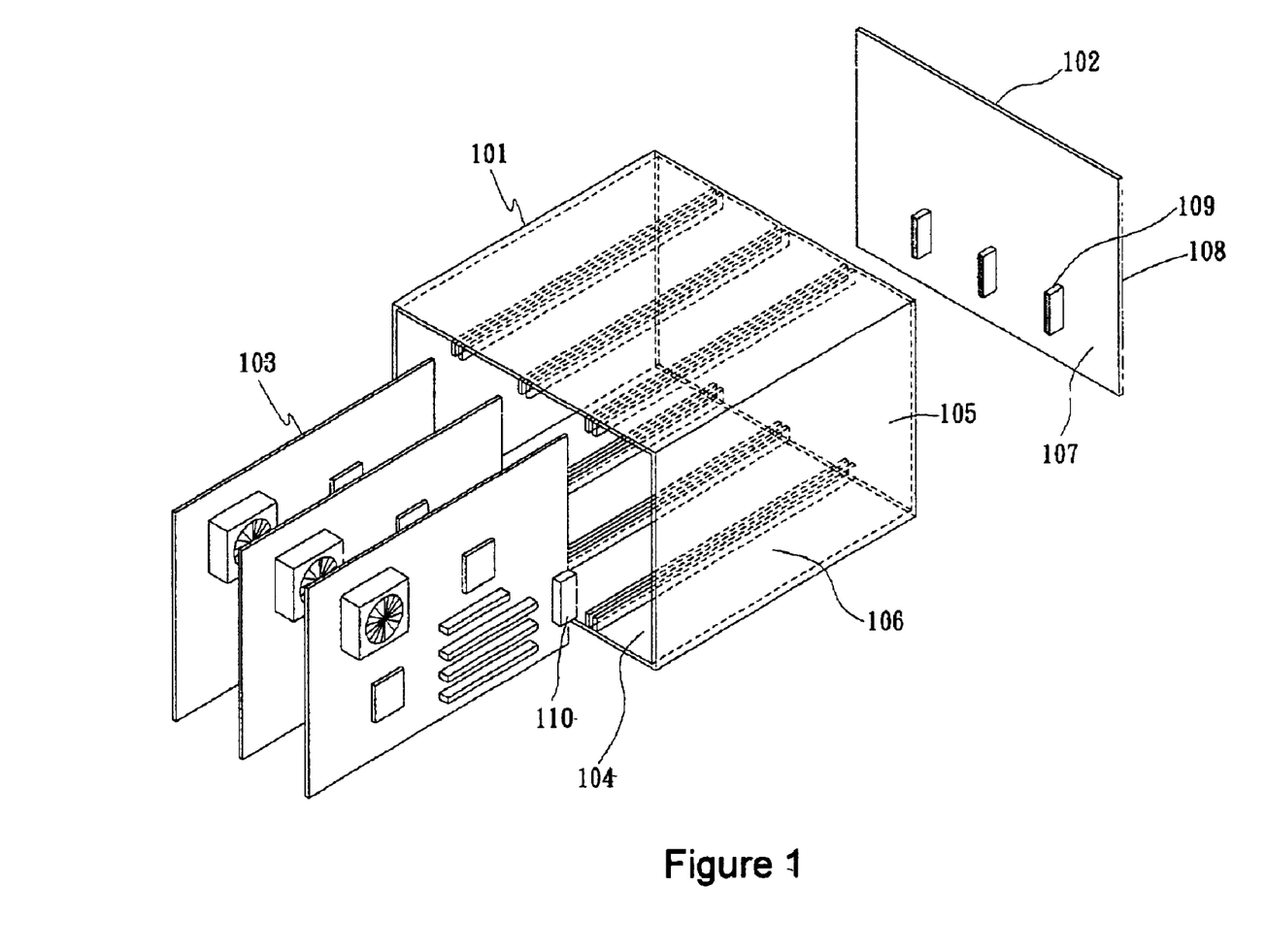
FIG. 1 illustrates a three-dimensional dissolution drawing of the server apparatus in the prior art.
Figure 2:
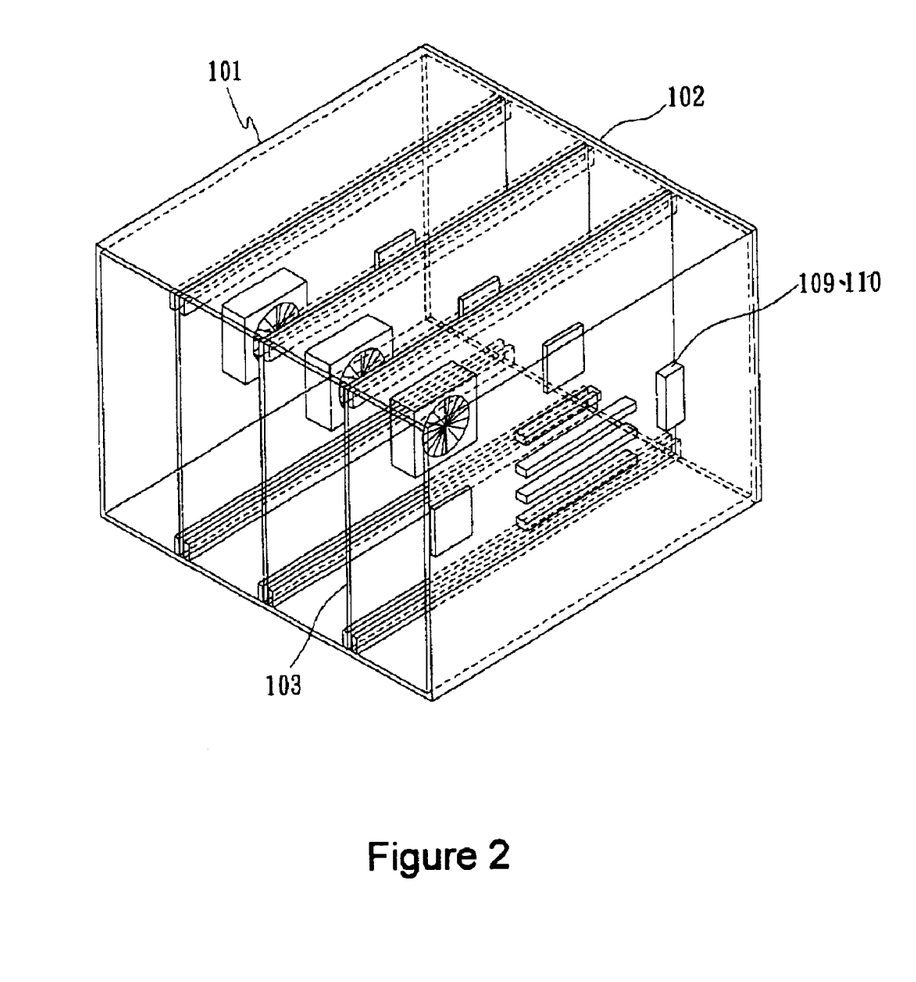
FIG. 2 illustrates a combination perspective drawing in the prior art.

In the prior art, the server apparatus comprises two parts; one is inserting a plurality of motherboards in a case, and there are connectors in the back of the motherboard to connect the corresponding connectors in the backboard in the back of the case. As shown in FIG. 1, there are a case 101, a backboard 102 and a plurality of motherboards 103. There are two breaches 104 and 105 respectively setting on the front and the back of the case 101, and there are a plurality of symmetric guiders 106 in the vertical inner side. The backboard 102 has two faces 107 and 108, one face 107 sticks on the breach 105 on the back of the case 101 and there are a plurality of connectors 109 (each connector 109 connects each other through electric signals) in the face 107. The back of the motherboard 103 at least sets a connector 110 that can completely set in the inner vertical symmetric guiders 106. While the motherboard 103 completely slides into the case 101, as shown in FIG. 2, the connectors 110 of the motherboard 103 connect the corresponding connectors 109 of the backboard 102. Each motherboard 103 communicates each other through connecting the backboard 102.

Figure 3:
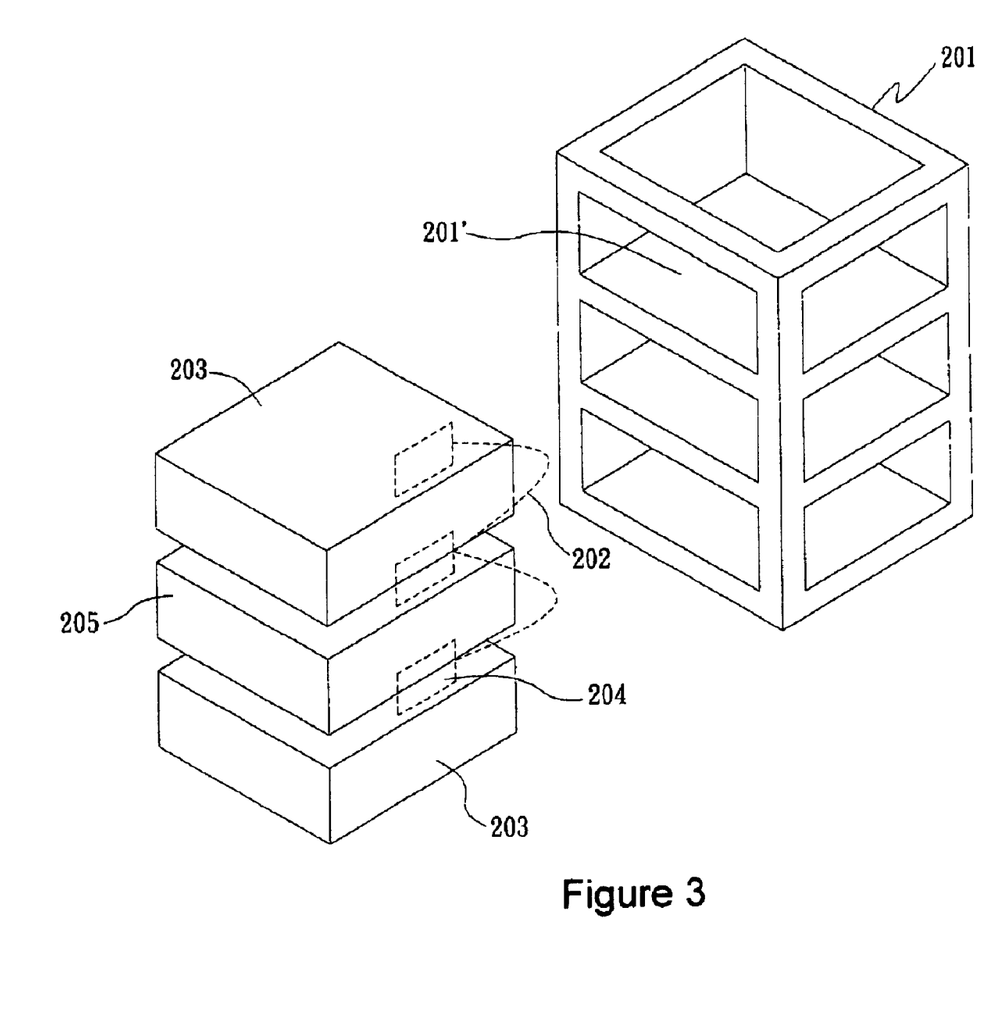
FIG. 3 illustrates a three-dimensional dissolution drawing of the server apparatus in the other prior art.
Figure 4:
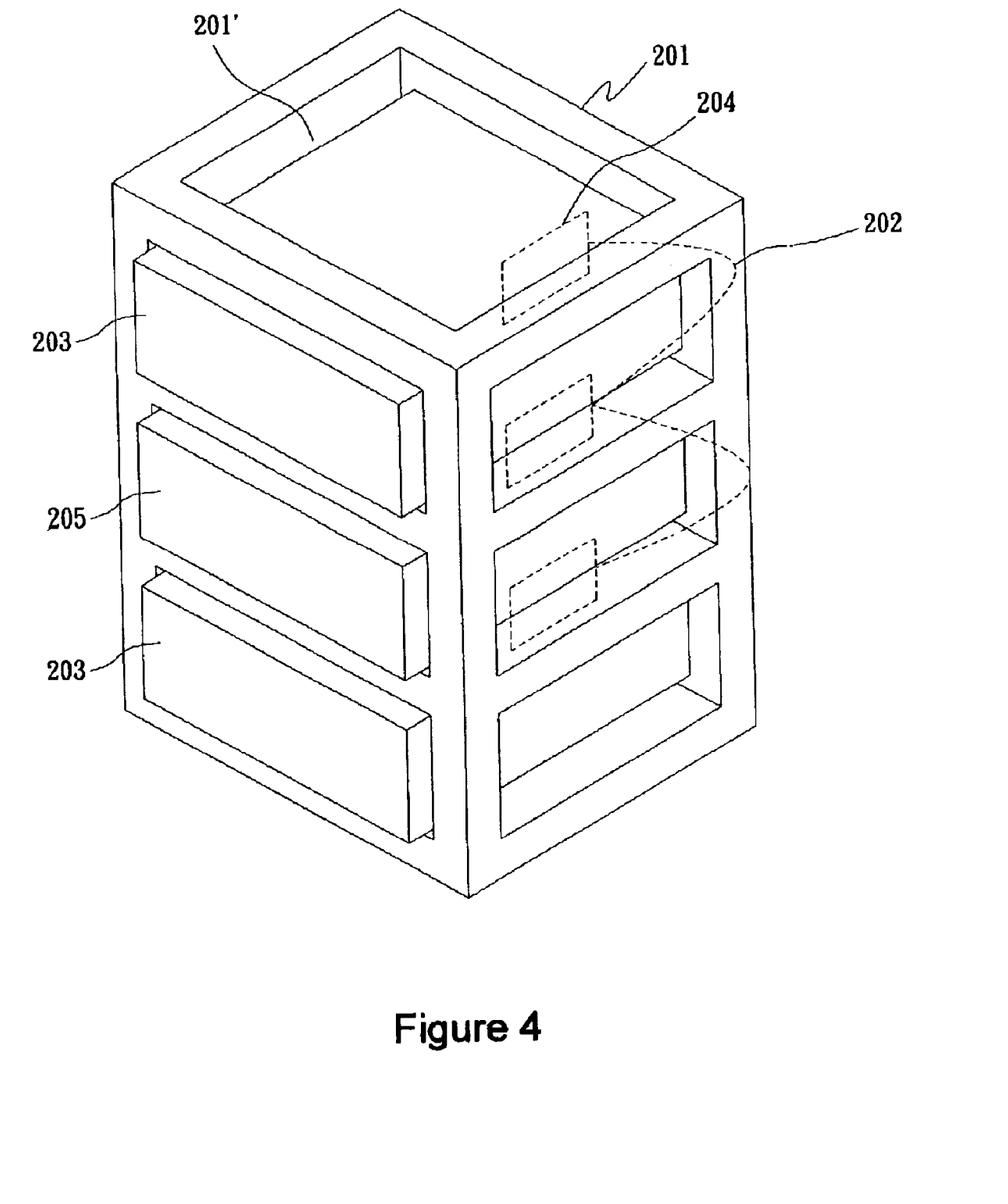
FIG. 4 illustrates a combination perspective drawing in the other prior art.

The other server apparatus sets a plurality of computers in a base, every computer directly connects a signal-exchange device through the network cable and the network adapter in the computer to communicates to each other. As shown in FIG. 3, there are a base structure 201, a plurality of connecting cables 202, a plurality of computers 203, network adapter 204 and a signal-exchange device 205. Referring to FIG. 4, each computer 203 and a signal-exchange device 205 stack up and down in the base structure 201 and the computers 203 directly connects a signal-exchange device 205 through the network cable 202 and the network adapter 204 in the computer 203.

In the foregoing server apparatus, the forward is to connect a plurality of motherboards 103, and the backward is to connect a plurality of computers 203; the computer 203 can operate independently so as to be operated by users, but the motherboard 103 lacks the power supply and the corresponding components, so the motherboard 103 should depend on the case for connecting the corresponding devices in the case to provide the function like computer 203. But the motherboards 103 connect each other only through a backboard; the computers 203 connect each other through a plurality of complicate network cables 202 and network adapters 204.

According to the foregoing description, the motherboard 103 should depend on the other corresponding devices in the case 101 and lack the function of independent operation as well as the defect that the computers 203 connect each other through a plurality of complicate network cables 202. In order to overcome these defect, this invention discloses a server apparatus.

SUMMARY OF THE INVENTION

The first objective of the invention discloses a server apparatus to solve the lack function of independent operation of the motherboard in the prior art.

The second objective of the invention discloses a server apparatus structure to solve the defect that the computers devices should connect each other through a plurality of complicate network cables.

This invention discloses a server apparatus, comprising a case, a backboard, at least a signal-exchange device and a plurality of computer devices. There are two breaches on the front and the back of the case, and there are a plurality of symmetric guiders in a vertical inner side. The backboard has two faces, one sticks on the breach of the back of the case and there are a plurality of connect-slots, said connect-slots electrically connecting to each other The back of the signal-exchange device sets at least a first connector and the vertical width of the device is smaller than the width of the guider; by this, we can set it in the symmetric guiders. The back of the computer device sets at least a second connector and the vertical width of the computer device is smaller than the width of the guider; by this, we can set it in the symmetric guiders. While the computer device and the signal-exchange device completely slide into the case, the first connector and the second connector wedge in the corresponding connect-slots. Besides, there is a gripper on each of the both sides in the front of the computer device and the signal-exchange device that stuck on the corresponding splinted trough on each of the both sides of the breach in the front of the case to stick on the computer device and the signal-exchange device into the case.

In the invention, each computer device and signal-exchange device has an independent power device that respectively applies its needing power as a power supply. In addition, each computer device and signal-exchange device further has an independent cooler device inside. Each computer device can either put into the server apparatus or be an independent server.

Besides, each computer device of the server apparatus in the invention directly communicates the signal-exchange device through the backboard, and then connects other external computer devices, server apparatuses and similar devices through backboard and the signal-exchange device. It can substantially lower the complicate degree of the external connecting of the server apparatus.

Furthermore, the backboard can become a shape of reverse T. By such Way, while the signal exchange device and a plurality of computer devices put into the case, it can provide the signal-exchange device and a plurality of computer devices more cooler space.

BRIEF DESCRIPTION OF DRAWINGS

The following detailed description, given by way of examples and not intended to limit the invention to the embodiment described herein, will be best to understood in conjunction with the accompanying drawings, in which.

DETAILED DESCRIPTION OF THE INVENTION

Figure 5:
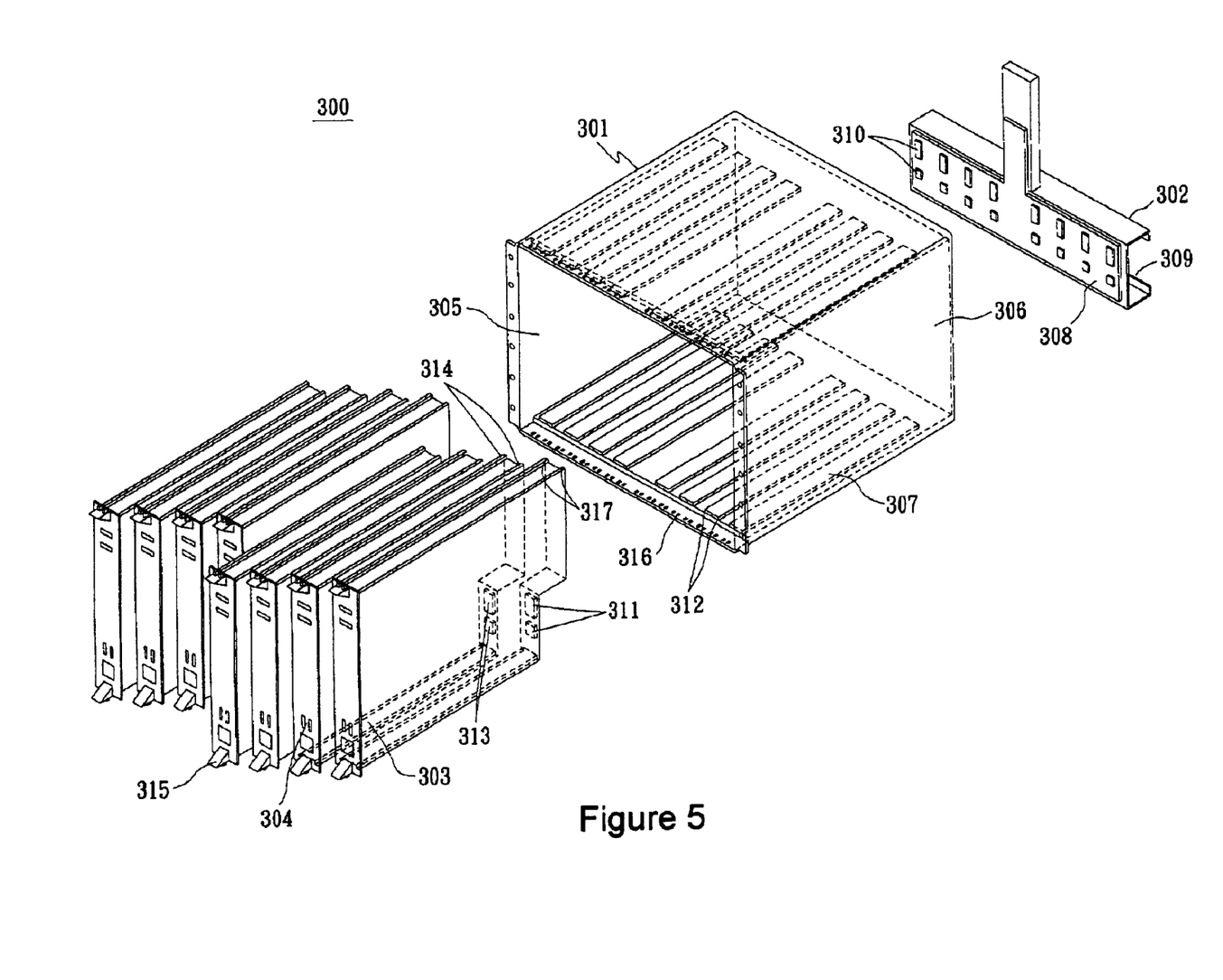
FIG. 5 illustrates a three-dimensional dissolution drawing one of the server apparatus in the invention.

Referring to FIG. 5, it discloses the server apparatus 300 of the invention, which comprises a case 301, a backboard 302, at least a signal-exchange device 303 and a plurality of computer devices 304. There are two breaches 305 and 306 on the front and the back of the case 301, and there are a plurality of symmetric guiders 307 in the vertical inner side. The backboard 302 is in the shape of inverse T, by that, while the signal-exchange device 303 and the computer devices 304 put into the case 301, it can provides the signal-exchange device 303 and a plurality of computer devices 304 more cooler space. Furthermore, the backboard 302 has two faces 308 and 309, the face 308 sticks on the breach 306 of the back of the case 301 and there are a plurality of connect-slots 310, said connect-slots electrically connecting to each other. The back of the signal-exchange devise 303 sets at least a first connector 311 and the vertical width 317 of the device 303 is smaller than the width 312 of the guider 307; by this, we can set it in the symmetric guiders 307. The back of the computer device 304 sets at least a second connector 313 and the vertical width 314 of the computer device 304 is smaller than the width 312 of the guider 307; by this, we can set it in the symmetric guiders 307. While the computer device 304 and the signal-exchange device 303 completely slide into the case 301, the first connector 311 and the second connector 313 wedge in the corresponding connect-slots 310.

Besides, there is a gripper 315 on each of the both sides in the front of the computer device 304 and the signal-exchange device 303 that stuck on the corresponding splinted trough 316 on each of the both sides of the breach in the front of the case 301.

Figure 6:
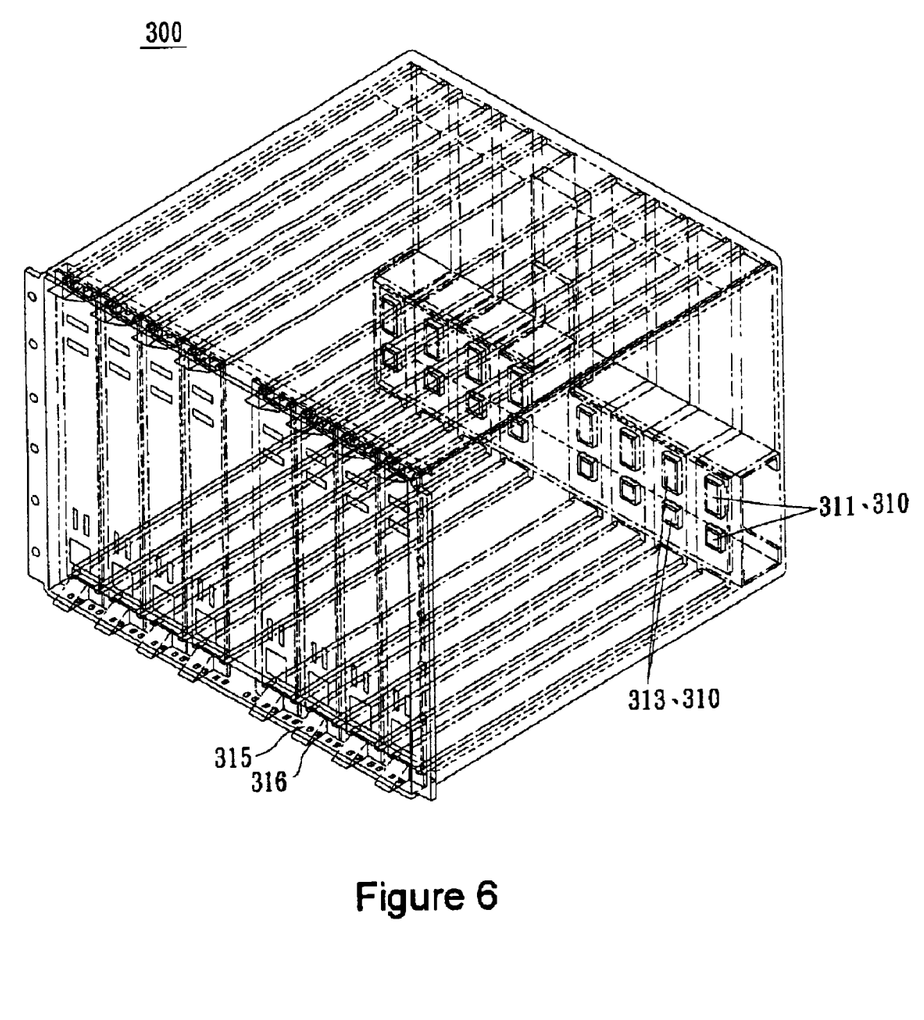
FIG. 6 illustrates a three-dimensional combination perspective drawing in the invention.

FIG. 6 illustrates a three-dimensional combination perspective drawing in the invention, while the computer device 304 and the signal-exchange device 303 completely slide into the case 301 through the guider 307 of the case 301, the first connector 311 and the second connector 313 wedge in the corresponding connect-slots 310. And the grippers 315 on the both sides in the front of the computer device 304 and the device 303 stuck on the corresponding splinted trough 316 on the both sides of the breach in the front of the case 301.

Figure 7:
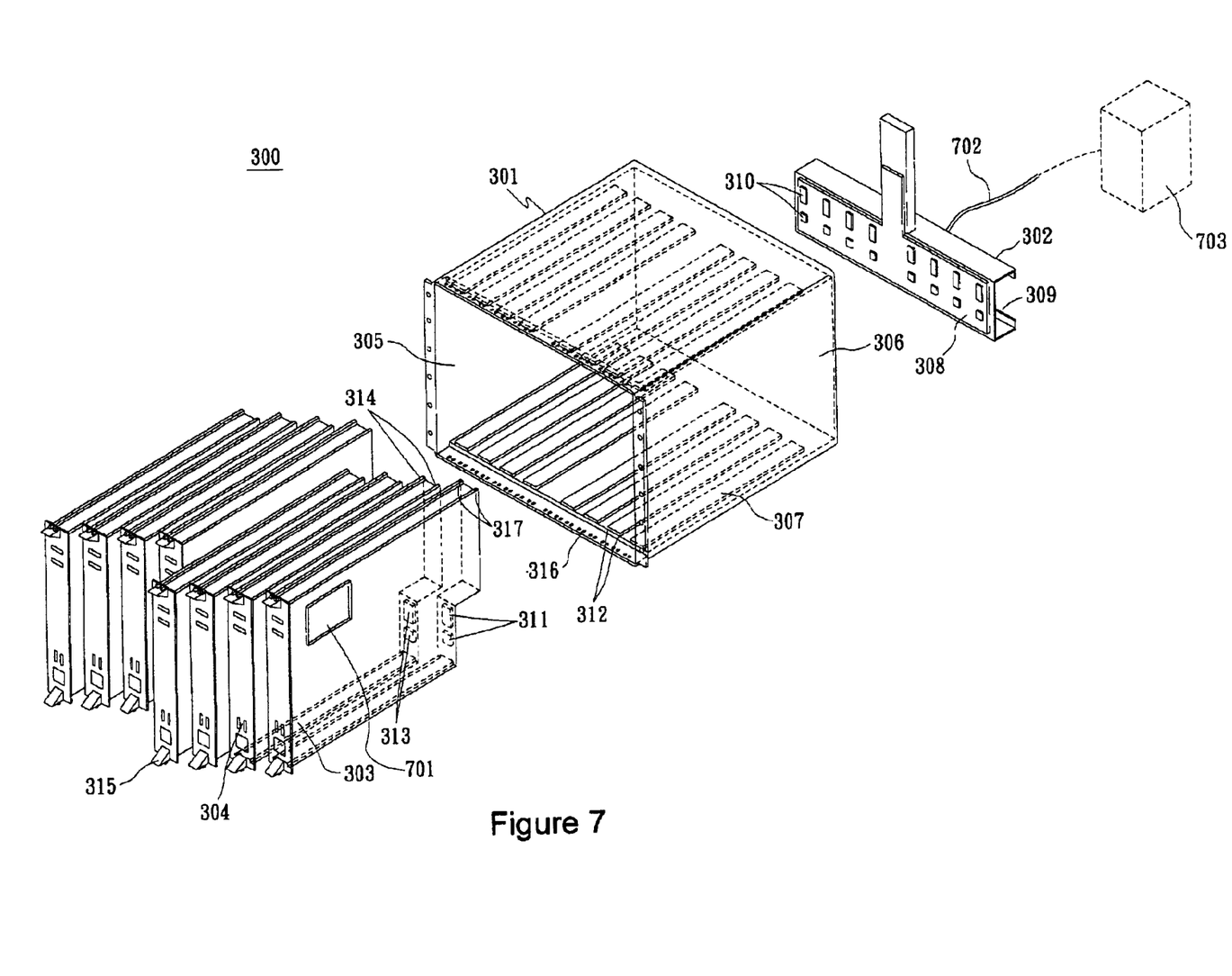
FIG. 7 illustrates a three-dimensional dissolution drawing two of the server apparatus in the invention.

Referring to FIG. 7, in the invention, there is an independent power device 701 that applies to personal computer (PC) as a power supply and an independent cooler device (not shown in the figure) in each computer device 304. Each computer device 304 can either put into the case 301 of the server apparatus 300 or be an independent server. Besides, each computer device 304 of the server apparatus 300 in the invention directly communicates to the signal-exchange device 315 through the backboard 302, and then connects 702 other external devices 703, such as computer devices, server apparatuses and similar devices through backboard 302 and the signal-exchange device 315. It can substantially lower the complicate degree of the external connecting of the server apparatus 300.

Although described above in connection with the preferred embodiments, one skilled in the art will appreciate that the present invention can be implemented in other embodiments while remaining within the scope of the present invention as defined in the appended claims.

What is claimed is:

1. A server apparatus comprising:
    a case having a first breach on a front side and a second breach on a back side, said case further having a plurality of symmetric guiders in an inner side,
    a backboard having a plurality of connecting slots, said connecting slots being electrically connected to each other,
    at least one signal-exchange device, a back of said signal-exchange device having at least a first connector, said signal-exchange device being received in said symmetric guiders, and
    at least one computer device, said computer device including a second connector, said computer device being received in said symmetric guiders; wherein
    when said computer device and said signal-exchange device are inserted into said case, said first connector and said second connector wedge into corresponding connecting slots.

2. The server apparatus of claim 1, wherein:
    said computer device has spring loaded grippers on top and bottom ends of a front side, each said gripper being received in a corresponding one of two troughs situated on top and bottom ends of said first breach of said case.

3. The server apparatus of claim 1, wherein:
    said signal-exchange device has spring loaded grippers on top and bottom ends of a front side, each said gripper being received in a corresponding one of two troughs situated on top and bottom ends of said first breach of said case.

4. The server apparatus of claim 1, wherein:
    said backboard is in the shape of an inverted T, so that when said signal-exchange device and said computer device are inserted into said case, said signal-exchange device and said computer device have more cooling space.

5. The server apparatus of claim 1, wherein:
    said computer device has an independent power device.

6. The server apparatus of claim 1, wherein:
    said computer device is a server.

7. The server apparatus of claim 1, wherein:
    said signal-exchange device is connected to external devices through said backboard.

8. The server apparatus of claim 7, wherein:
    said external devices include computer devices or server apparatuses.

9. A server apparatus comprising:
    a case having a first breach and a second breach,
    a backboard received in said second breach, said backboard having at least one connecting slot therein,
    at least one computer device, a back of said computer device including at least one connector, said computer device further having spring loaded grippers on top and bottom ends of a front side, each said gripper being received in a corresponding one of two troughs situated on top and bottom ends of said first breach of said case; wherein
    when said computer device is inserted into said case through said first breach of said case, said connector wedges in a corresponding one of said connecting slots.

10. A server apparatus comprising:
    a case having a first breach, a second breach, and a plurality of symmetric guiders in an inner side of said case,
    a backboard received in said second breach, said backboard having at least one connecting slot therein,
    at least one computer device including a connector such that when said computer device is inserted into said case through said first breach in said case, said connector wedges in a corresponding one of said connecting slots, and at least one signal-exchange device, said signal-exchange device being received in one of said symmetric guiders; wherein said signal-exchange device has spring loaded grippers on top and bottom ends of a front side, each said gripper being received in a corresponding one of two troughs situated on top and bottom ends of said first breach of said case.

11. The server apparatus of claim 10, wherein:

a width of said computer device is smaller than a width of said guider so that said computer device fits into said symmetric guiders.

12. The server apparatus of claim 10, wherein:

said computer device has spring loaded grippers on top and bottom ends of a front side, each said gripper being received in a corresponding one of two troughs situated on top and bottom ends of said first breach of said case.

13. The server apparatus of claim 10, wherein:

said signal-exchange device has at least one connector in a back of said signal-exchange device, so that when said signal-exchange device is inserted into said case through said first breach of said case, said connector wedges in a corresponding one of said connecting slots.

14. The server apparatus of claim 10, wherein:

said connecting slots are electrically connected to each other.

15. The server apparatus of claim 10, wherein:

said backboard is in the shape of an inverted T, so that when said signal-exchange device and said computer device are inserted into said case, said signal-exchange device and said computer device have more cooling space.

16. The server apparatus of claim 10, wherein:

said computer device has an independent power device.

17. The server apparatus of claim 10, wherein:

said computer device is a server.

18. The server apparatus of claim 10, wherein:

said signal-exchange device is connected to external devices through said backboard.

19. The server apparatus of claim 10, wherein:

said external devices include computer devices or server apparatuses.

\* \* \* \* \*